_(12)_ United States Patent
Kwon et al.

(10) Patent No.: US 9,978,997 B2
(45) Date of Patent: May 22, 2018

(54) ORGANIC LIGHT EMITTING DISPLAY DEVICE AND METHOD OF FABRICATING THE SAME

(71) Applicant: LG Display Co., Ltd., Seoul (KR)

(72) Inventors: JunYoung Kwon, Busan (KR); SungHun Kim, Jeollabuk-do (KR); MiSo Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days. days.

(21) Appl. No.: 15/367,643

(22) Filed: Dec. 2, 2016

(65) Prior Publication Data

US 2017/0084883 A1 Mar. 23, 2017

Related U.S. Application Data

(62) Division of application No. 14/065,677, filed on Oct. 29, 2013, now Pat. No. 9,530,826.

(30) Foreign Application Priority Data

Oct. 31, 2012 (KR) .................. 10-2012-0122699

(51) Int. Cl.
*H01L 21/66* (2006.01)
*G01R 31/26* (2014.01)
(Continued)

(52) U.S. Cl.
CPC .......... *H01L 51/56* (2013.01); *H01L 27/3244* (2013.01); *H01L 51/0097* (2013.01);
(Continued)

(58) Field of Classification Search
CPC .......... H01L 2227/323; H01L 27/3244; H01L 51/0097; H01L 51/5253; H01L 51/56; H01L 2251/566
See application file for complete search history.

(56) References Cited

U.S. PATENT DOCUMENTS

2007/0205719 A1 9/2007 Kim
2007/0273271 A1 11/2007 Yamazaki et al.
(Continued)

FOREIGN PATENT DOCUMENTS

CN 1819728 A 8/2006
CN 101051675 A 10/2007
(Continued)

OTHER PUBLICATIONS

First Notification of Office Action dated Nov. 4, 2015 from The State Intellectual Property Office of China in counterpart Chinese application No. 201310519853.1.

*Primary Examiner* — Meiya Li
(74) *Attorney, Agent, or Firm* — Morgan, Lewis & Bockius LLP (57) ABSTRACT

The present disclosure relates to an organic light emitting display device including a substrate having an outer part and a display part, a driving thin film transistor on each of a plurality of pixel regions within the display part of the substrate, a pixel electrode on each pixel region of the display part, an organic light emitting unit on each pixel region of the display part to emit light, a common electrode on the organic light emitting unit and a bank layer to apply a signal to the organic light emitting layer, and a first passivation layer, an organic insulating layer and a second passivation layer on the outer part and the display part, wherein the first passivation layer and the second passivation layer are removed from the outermost region of the outer part, so that the substrate is exposed to the outside.

11 Claims, 11 Drawing Sheets

(51) Int. Cl.
*H01L 51/56* (2006.01)
*H01L 27/32* (2006.01)
*H01L 51/52* (2006.01)
*H01L 51/00* (2006.01)

(52) U.S. Cl.
CPC .... *H01L 51/5253* (2013.01); *H01L 2227/323* (2013.01); *H01L 2251/566* (2013.01)

(56) References Cited

U.S. PATENT DOCUMENTS

| | | |
|---|---|---|
| 2008/0203904 A1 | 8/2008 | Kim et al. |
| 2011/0223697 A1* | 9/2011 | Yong-Hwan ........ H01L 27/1266 438/28 |
| 2013/0126915 A1 | 5/2013 | Chan et al. |
| 2013/0299789 A1 | 11/2013 | Yamazaki et al. |

FOREIGN PATENT DOCUMENTS

| | | |
|---|---|---|
| CN | 102522421 A | 6/2012 |
| KR | 20080078956 A | 8/2008 |
| KR | 20110067405 A | 6/2011 |

* cited by examiner

ORGANIC LIGHT EMITTING DISPLAY DEVICE AND METHOD OF FABRICATING THE SAME

CROSS-REFERENCE TO RELATED APPLICATION

This is a Divisional of U.S. patent application Ser. No. 14/065,677, filed on Oct. 29, 2013, which claims the benefit of Korean Patent Application No. 10-2012-0122699, filed on Oct. 31, 2012, both of which are hereby incorporated by reference for all purposes as if fully set forth herein.

BACKGROUND OF THE DISCLOSURE

1. Field of the Disclosure

This specification relates to an organic light emitting display device and a fabricating method thereof, and more particularly, to an organic light emitting display device capable of preventing an occurrence of deterioration or defect due to permeation of air or moisture through cracks formed on a passivation layer, and a fabricating method thereof.

2. Background of the Disclosure

In recent time, various types of flat panel display devices capable of reducing weights and volumes, which are disadvantages of a cathode ray tube, are being developed. Examples of the flat panel display device include a liquid crystal display (LCD) device, a field emission display device, a plasma display panel, an organic light emitting display device, and the like.

Among those flat panel display devices, the plasma display device is focused on as a display device, which is light, thin, short and small and the most advantageous for providing a large-scaled screen, by virtue of simplified structure and fabricating processes. However, the plasma display device also has disadvantages in view of low luminous efficiency and brightness and high power consumption. On the other hand, the LCD device has disadvantages in view of being difficult to implement a large screen due to the use of a semiconductor process and causing high power consumption due to a backlight unit. Also, the LCD device exhibits a great optical loss and a narrow viewing angle due to optical elements, such as a polarizing filter, a prism sheet, a diffusion plate and the like.

On the contrary, light emitting display devices are classified into an inorganic light emitting display device and an organic light emitting display device according to a material of a light emitting layer. The organic light emitting display device is a self-light emitting device, which has great advantages in the aspects of fast response speed, high luminous efficiency, high brightness, and a large viewing angle. The inorganic light emitting display device causes high power consumption and is unable to obtain high brightness, as compared with the organic light emitting display device. Also, the inorganic light emitting display device cannot emit light with various colors of red (R), green (G) and blue (B). On the other hand, the organic light emitting display device is actively being studied by virtue of several advantages, such as being able to be driven by a low DC voltage, which is several tens of volts, having a fast response speed, providing high brightness, and emitting various colors of R, G and B.

Meanwhile, a flexible display device using a flexible substrate, such as a plastic substrate, has been proposed for portability and convenience in use. However, when the flexible substrate is applied to the organic light emitting display device, impurities or foreign materials, such as moisture or air may easily permeate through an upper substrate of the organic light emitting display device because the upper substrate of the display device is also formed of a flexible protection film or the like. Due to the permeation of the impurities such as moisture or air, a defective organic light emitting display device is fabricated and a lifespan of the device is reduced.

SUMMARY OF THE DISCLOSURE

Therefore, to obviate those drawbacks of the related art, an aspect of the detailed description is to provide an organic light emitting display device capable of preventing permeation of moisture, through a crack, which is generated on a passivation layer during cutting of a mother substrate due to non-formation of the passivation layer between adjacent panel regions of a plurality of panel regions of the mother substrate, and a fabricating method thereof.

To achieve these and other advantages and in accordance with the purpose of this specification, as embodied and broadly described herein, there is provided an organic light emitting display device including a substrate having an outer part and a display part, a driving thin film transistor formed on each of a plurality of pixel regions within the display part of the substrate, a pixel electrode formed on each pixel region of the display part, an organic light emitting unit formed on each pixel region of the display part, the organic light emitting unit emitting light, a common electrode formed on the organic light emitting unit and a bank layer to apply a signal to the organic light emitting layer, and a first passivation layer, an organic insulating layer and a second passivation layer formed on the outer part and the display part, wherein the first passivation layer and the second passivation layer are removed from the outermost region of the outer part, so that the substrate is exposed to the outside.

The first and second passivation layers may be made of an inorganic material, and the substrate may be a flexible substrate made of polyimide To achieve these and other advantages and in accordance with the purpose of this specification, as embodied and broadly described herein, there is provided a method for fabricating an organic light emitting display device including providing a mother substrate having a plurality of panel regions, attaching a substrate having a display part and an outer part onto each panel region of the mother substrate, forming an organic light emitting structure of the display part of the substrate, forming a first passivation layer on the display part of the substrate and a partial region of the outer part, forming an organic layer on the first passivation layer, forming a second passivation layer on the display part on the organic layer and a partial region of the outer part, dividing the mother substrate into a plurality of panel regions by cutting the mother substrate exposed to the outside between the adjacent panel regions of the mother substrate, and separating the mother substrate from the substrate.

The forming of the organic light emitting structure may include forming a thin film transistor on each pixel, forming a first electrode on each pixel, forming an organic light emitting unit on the first electrode, the organic light emitting unit emitting light, and forming a second electrode on the organic light emitting unit.

In accordance with the present disclosure, when a plurality of display panels are formed on a large-scaled mother substrate, various electrodes and light emitting layers may be formed on a flexible plastic substrate, without forming a passivation layer on a region between the adjacent display panels. This may prevent a production of cracks on the passivation layer during a cutting process when individual organic light emitting display devices are separated by cutting the mother substrate with a plurality of panel regions. Therefore, a defective organic light emitting display device, which may be caused due to permeation of moisture or foreign materials into the organic light emitting display device along into cracks produced on the passivation layer, can be prevented.

Further scope of applicability of the present application will become more apparent from the detailed description given hereinafter. However, it should be understood that the detailed description and specific examples, while indicating preferred embodiments of the disclosure, are given by way of illustration only, since various changes and modifications within the spirit and scope of the disclosure will become apparent to those skilled in the art from the detailed description.

BRIEF DESCRIPTION OF THE DRAWINGS

The accompanying drawings, which are included to provide a further understanding of the disclosure and are incorporated in and constitute a part of this specification, illustrate exemplary embodiments and together with the description serve to explain the principles of the disclosure.

In the drawings.

DETAILED DESCRIPTION OF THE DISCLOSURE

Description will now be given in detail of the exemplary embodiments, with reference to the accompanying drawings. For the sake of brief description with reference to the drawings, the same or equivalent components will be provided with the same reference numbers, and description thereof will not be repeated.

In an organic light emitting display device according to the present disclosure, upon forming a plurality of display panels on a large mother substrate, various electrodes and light emitting layers may be formed on a flexible plastic substrate, without forming a passivation layer on a region between the adjacent display panels. This may prevent a production of cracks on the passivation layer during a cutting process of cutting the mother substrate, which may result in prevention of permeation of moisture or foreign materials through the cracks.

Figure 1:
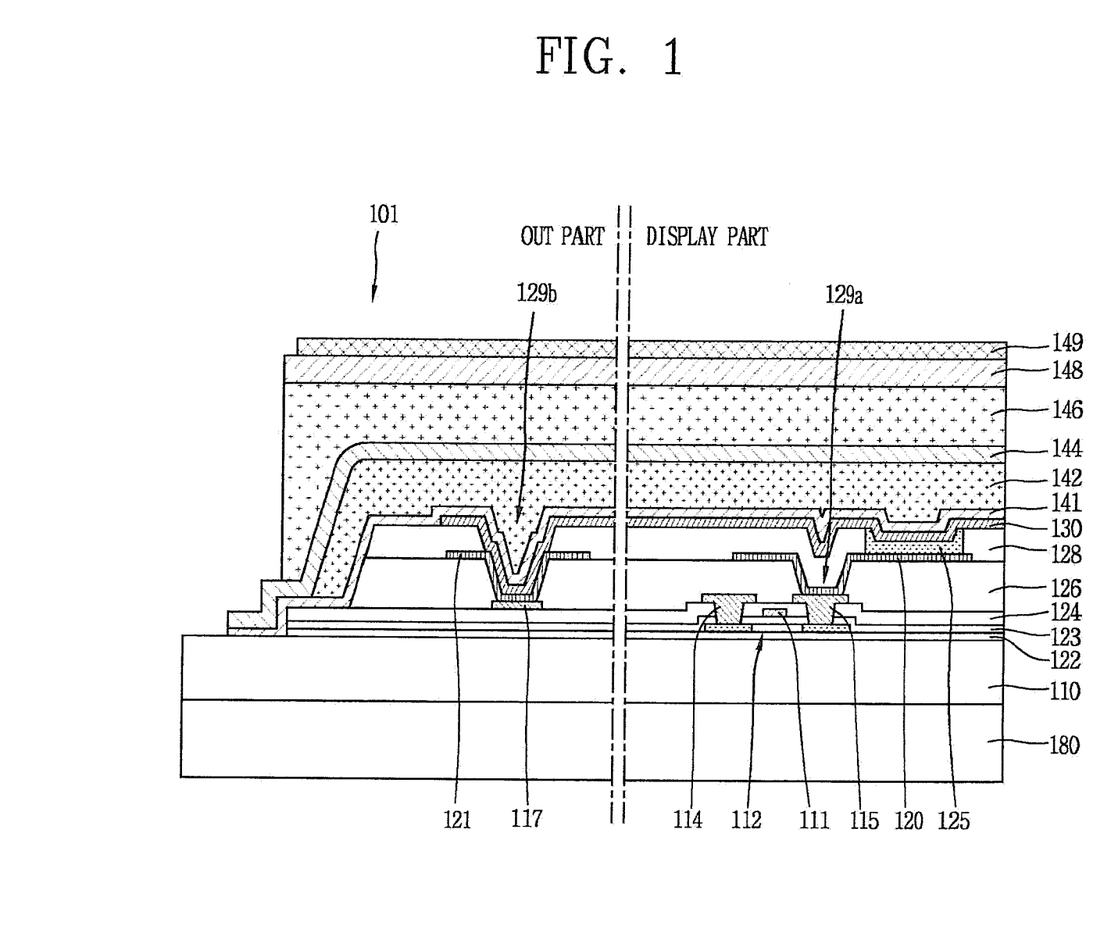
FIG. 1 is a view of a structure of an organic light emitting display device in accordance with the present disclosure.

FIG. 1 is a view of a structure of an organic light emitting display device in accordance with the present disclosure. In general, an organic light emitting display device may include a plurality of R, G and B pixels which emit red light, green light and blue light. In the drawing, the outermost region and an outer part of pixels of two panels which are adjacent to each other are illustrated for the sake of explanation.

Referring to FIG. 1, an organic light emitting display device 101 according to the present disclosure may include a display part having a plurality of pixel regions for implementing a real image, and a pad part (or outer part) having a pad which is formed on an outer side of the display part for transferring an external signal into the display part.

A driving thin film transistor (TFT) may be formed on the display part of a substrate 110 which is made of a flexible material such as plastic. Although not shown, the driving TFT may be formed on each of the R, G and B pixel regions, and include a buffer layer 122 formed on the substrate 110, a semiconductor layer 112 formed on the R, G and B pixel regions on the buffer layer 122, a first insulating layer 123 formed on the entire substrate 110 having the semiconductor layer 112, a gate electrode 111 formed on the first insulating layer 123, a second insulating layer 124 formed on the entire substrate 110 to cover the gate electrode 111, and a source electrode 114 and a drain electrode 115 which come in contact with the semiconductor layer 112 through contact holes formed through the first insulating layer 123 and the second insulating layer 124.

The buffer layer 122 may be implemented into a single layer or a plurality of layers. The semiconductor layer 112 may be made of a transparent oxide semiconductor such as crystalline silicon or indium gallium zinc oxide (IGZO). The semiconductor layer 112 may include a channel layer on a central region thereof and doped layers on both sides thereof. The source electrode 114 and the drain electrode 115 may come in contact with the doped layers, respectively.

The gate electrode 111 may be made of a metal such as Cr, Mo, Ta, Cu, Ti, Al or Al alloy. The first insulating layer 123 and the second insulating layer 124 may have a single layer made of an inorganic insulating material such as $SiO_2$ or SiNx, or a dual layer made of $SiO_2$ and SiNx. Also, the source electrode 114 and the drain electrode 115 may be made of Cr, Mo, Ta, Cu, Ti, Al or Al alloy.

On the substrate 110 having the driving TFT may be formed a third insulating layer 126. The third insulating layer 126 may be made of an inorganic insulating material such as $SiO_2$.

Although not shown, an overcoat layer for planarizing the substrate 110 may be formed on the third insulating layer 126.

Also, a common pad 117 may be formed on the second insulating layer 124 of the substrate 110 located on the pad part or the outer part. The common pad 117 may be formed to transfer a signal applied from the exterior into a common electrode within the display part. The common pad 117 may be formed by the same process as the source electrode 114 and the drain electrode 115 of the driving TFT.

Although not shown, the outer part may be provided with a gate pad for applying a scan signal to the gate electrode 111 of the driving TFT, and a data pad for applying a signal to a pixel electrode.

A first contact hole 129a may be formed through the third insulating layer 126 on the drain electrode 115 of the driving TFT, which is formed on each pixel region of the display part. Accordingly, a pixel electrode 120 formed on the third insulating layer 126 may electrically come in contact with the drain electrode 115 of the driving TFT through the first contact hole 129a.

A second contact hole 129b may also be formed through the third insulating layer 126 on the common pad 117 of the outer part, to externally expose the common pad 117.

A bank layer 128 may be formed on a boundary between the adjacent pixel regions on the third insulating layer 126 within the display part. The bank layer 128 may be a type of barrier wall, which partitions each pixel region to prevent light of specific colors, output from adjacent pixel regions, from being output in a mixed state. Also, the bank layer 128 may reduce a stepped portion by filling a part of the contact hole 129a. This may prevent the occurrence of a defective organic light emitting unit due to an excessive stepped portion during formation of the organic light emitting unit.

The bank layer 128 may extend to the outer part. Here, a contact hole may also be formed on the bank layer 128 located on the pad 117 of the outer part. Accordingly, the pad 117 may be externally exposed through the bank layer 128. Meanwhile, an outer end portion of the bank layer 128 may be located on almost the same line with an end portion of the third insulating layer 126, which may prevent a formation of a stepped portion between the third insulating layer 126 and the bank layer 128.

The pixel electrode 120 may be formed on the display part and a metal layer 121 may be formed on the outer part. The pixel electrode 120 may be made of a metal, such as Ca, Ba, Mg, Al, Ag and the like, and connected to the drain electrode 115 of the driving TFT so as to allow for reception of an image signal applied from the exterior. The metal layer 121, similar to the pixel electrode 120, may be made of the metal, such as Ca, Ba, Mg, Al, Ag and the like. The metal layer 121 may reduce contact resistance between the common electrode, which is to be formed later, and the common pad 117, allowing a signal to be transferred to the common electrode without delay.

The pixel electrode 120 and the metal layer 121 may be formed of the same metal by the same process. However, they may also be formed of different types of metals by different processes.

An organic light emitting unit 125 may be formed on the pixel electrode 120 on the bank layer 128. The organic light emitting unit 125 may include an R-organic light emitting layer emitting red light, a G-organic light emitting layer emitting green light, and a B-organic light emitting layer emitting blue light. Although not shown, the organic light emitting unit 125 may also include, in addition to the organic light emitting layers, an electron injection layer and a hole injection layer formed on the organic light emitting layers for injecting electrons and holes into the organic light emitting layers, respectively, and an electron transport layer and a hole transport layer for transporting the injected electrons and holes to the organic light emitting layers, respectively.

Also, the organic light emitting layers may be implemented as a white organic light emitting layer for emitting white light. Here, R, G and B color filter layers may be formed below the white organic light emitting layer, for example, on R, G and B sub pixels regions on the insulating layer 124, respectively, to convert the white light emitted from the white organic light emitting layer into red light, green light and blue light. The white organic light emitting layer may be formed by mixing a plurality of organic materials which emit RGB monochromic light, respectively, or by depositing a plurality of light emitting layers which emit RGB monochromic light, respectively.

A common electrode 130 may be formed on the organic light emitting unit 125 of the display part. The common electrode 130 may be made of transparent metal oxide, such as indium tin oxide (ITO) or indium zinc oxide (IZO).

Here, the common electrode 130 may be an anode of the organic light emitting unit 125 and the pixel electrode 120 may be a cathode of the organic light emitting unit 125. When a voltage is applied to the common electrode 130 and the pixel region 120, electrons may be injected from the pixel electrode 120 into the organic light emitting unit 125, and holes may be injected from the common electrode 130 into the organic light emitting unit 125. The electrons and the holes may then be excited in the organic light emitting layer so as to generate excitons. As the excitons decay, light corresponding to an energy difference between lowest unoccupied molecular orbital (LUMO) and highest occupied molecular orbital (HOMO) of the light emitting layer may be generated and emitted to the outside (toward an upper side of the common electrode 130 in the drawing).

Also, the common electrode 130 may also be formed on the second contact hole 129b of the outer part. The common electrode 130 of the outer part may be connected to the common pad 117 through the metal layer 121 within the second contact hole 129b and also connected to the common electrode 130 of the display part, so as to allow an external signal to be applied to the common electrode 130 through the common pad 117.

A first passivation layer 141 may be formed on the common electrode 130 of the outer part and the display part and on the bank layer 128 throughout the substrate 110. The first passivation layer 141 may be made of an inorganic material such as $SiO_2$ or $SiNx$.

An organic layer 142 made of an organic material such as polymer or the like may be formed on the first passivation layer 141, and a second passivation layer 144 made of an inorganic material such as $SiO_2$ or $SiNx$ may be formed on the organic layer 142.

An adhesive may be coated on the second passivation layer 144 to form an adhesive layer 146, and a protection film 148 may be disposed on the adhesive layer 146. Accordingly, the protection film 148 may be attached by virtue of the adhesive layer 146.

Any material may be used as the adhesive if it has a high adhesive force, high thermal resistance, and high water resistance. The present disclosure may generally use thermosetting resin, such as epoxy-based compound, acrylate-based compound or acryl-based rubber. Here, the adhesive layer 146 may be coated by a thickness of about 5 to 100 μm, and cured (hardened) at temperature of about 80 to 170° C. Photocurable resin may also be used as the adhesive. In this case, the adhesive layer 146 may be cured by irradiating light such as ultraviolet rays.

The adhesive layer 146 may also serve as a sealing member for preventing permeation of moisture into the organic light emitting display device, as well as bonding the substrate 110 and the protection film 148. Therefore, the reference numeral 146 is represented by the adhesive in the detailed description of the present disclosure but it is merely the sake for explanation. The adhesive layer may also be referred to as a sealing member.

The protection film 148, an encapsulation cap for sealing (encapsulating) the adhesive layer 146, may be implemented as polystyrene (PS) film polyethylene (PE) film, polyethylene naphthalate (PEN) film, polyimide (PI) film or the like.

A polarizing plate 149 may be attached onto the protection film 148. The polarizing plate 149 may improve quality of image by allowing light emitted from the organic light emitting display device to be transmitted therethrough and prevent external incident light from being reflected thereby.

In the meantime, in the organic light emitting display device having the configuration, the driving TFT, the organic light emitting unit 125, the pixel electrode 120, the common electrode 130, the various insulating layers and passivation layers may be formed on the display part, and various pads, insulating layers and passivation layers may be formed on the outer part. Here, any insulating layer and passivation layer may not be formed on an edge region of the outer part, namely, the outermost region of the organic light emitting display device. This will be explained hereinafter.

Figure 2:
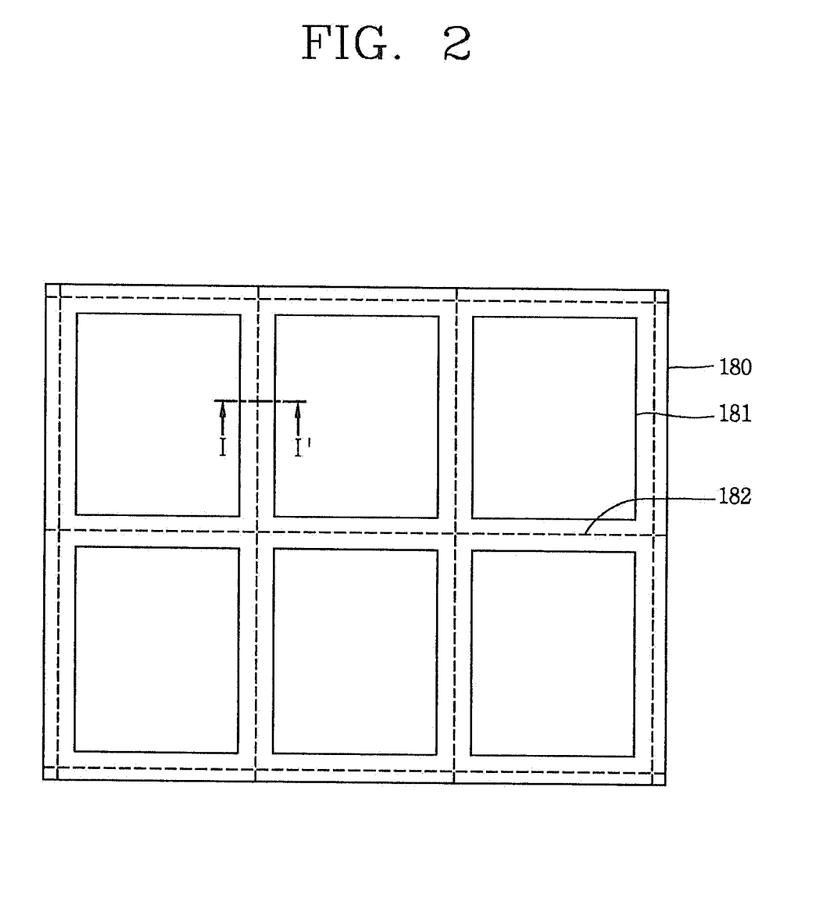
FIG. 2 is a view illustrating a formation of a plurality of panel regions on a mother substrate.

Referring to FIG. 2, the organic light emitting display device may be formed in a unit of mother substrate 180. That is, as illustrated in FIG. 2, after forming a plurality of display panels 181 by forming the driving TFTs, various electrodes and various insulating layers on the mother substrate 180 through a variety of processes, the mother substrate 180 may be cut at dashed lines 182 by a cutting tool such as a cutting wheel or the like into unit display panels, thereby completely fabricating the organic light emitting display device.

Figure 3:
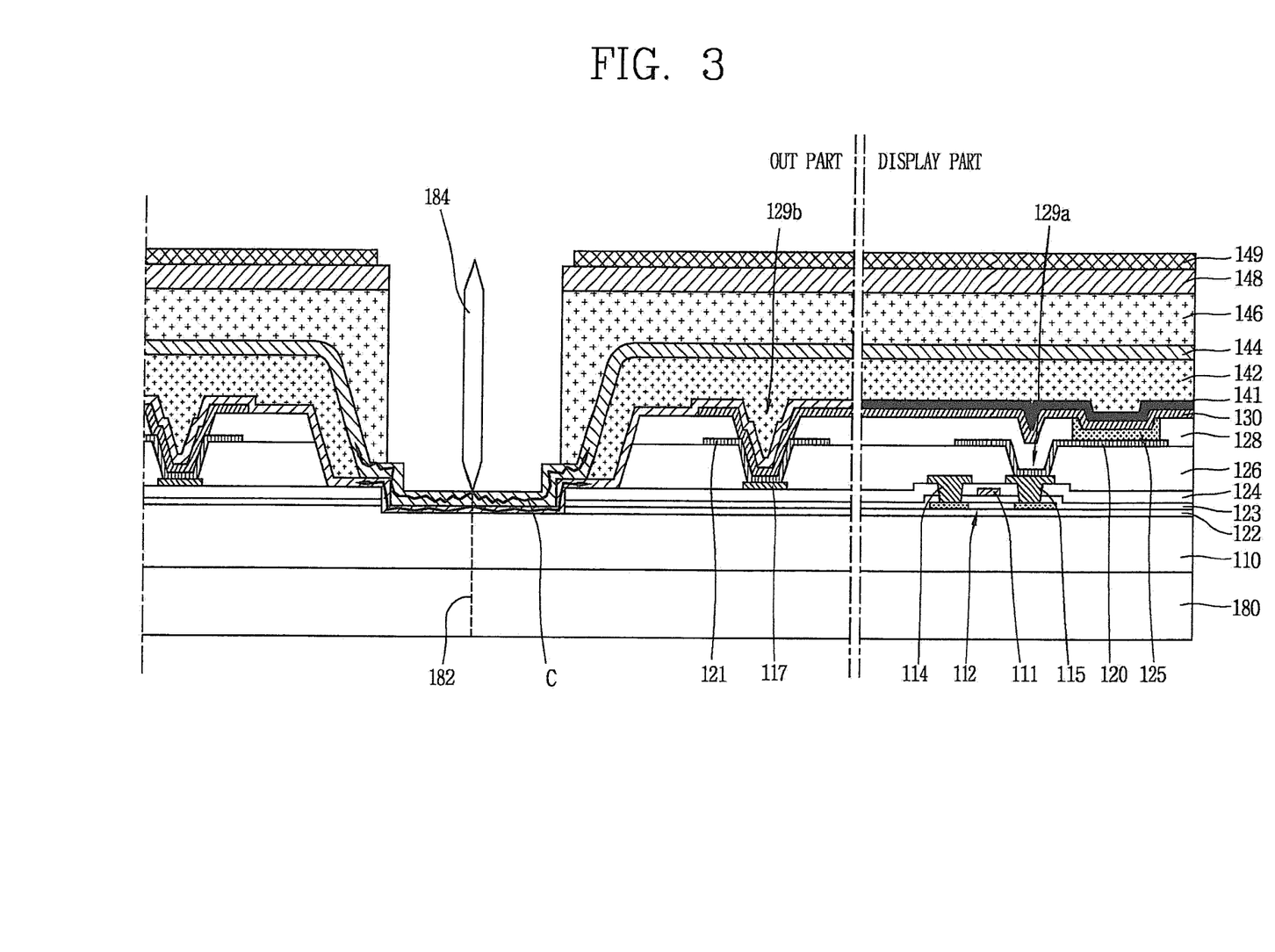
FIG. 3 is a view illustrating that a crack is formed on a passivation layer during a cutting process when the passivation layer is deposited between the panel regions.

FIG. 3 is a sectional view taken along the line I-I' of FIG. 2, which illustrates that the mother substrate 180 is cut into unit panels by a cutting wheel. Here, the drawing merely illustrates only the outer parts of two adjacent display panels without the display part, for the sake of explanation.

Referring to FIG. 3, when the first passivation layer 141 and the second passivation layer 144 are formed on the outermost region of the organic light emitting display device, namely, between the adjacent display panels when being fabricated in the unit of mother substrate, upon cutting the mother substrate 180 having the first passivation layer 141 and the second passivation layer 144 by use of a cutting wheel 184, the cutting wheel 184 may go down even into the mother substrate 180 through the first and second passivation layers 141 and 144 and the first substrate 110.

Accordingly, cracks C may be generated on the first and second passivation layers 141 and 144 by the cutting wheel 184. The cracks C may extend even down to the organic layer 142 located within the outer part along the first and second passivation layers 141 and 144. The cracks C may become a permeating path of moisture and foreign materials. When the organic light emitting display device is fabricated, such moisture and foreign materials may permeate into the organic light emitting display device through the cracks C to cause a reduction of lifespan and a defect of the organic light emitting display device.

The applicant has executed several times a test of cutting a 4.3-inch organic light emitting display device formed as the unit of mother substrate under conditions that a temperature is 85° C. and moisture is 85%. It has been noticed from the repetitive test that probability that the cracks C, which are formed on the first and second passivation layers 141 and 144 by cutting the fabricated organic light emitting display device, reach the organic layer 142 is about 50%, and permeation of moisture and foreign materials is observed from all of the organic light emitting display devices having cracks.

As such, when the first passivation layer 141 and the second passivation layer 144 are formed between the adjacent panels, moisture may permeate into about 50% of organic light emitting display devices. The permeation of moisture may cause many problems in reliability of the organic light emitting display device.

On the other hand, the present disclosure may not form the first passivation layer 141 and the second passivation layer 144 between panels. Accordingly, cutting of the first and second passivation layers 141 and 144 by the cutting tool may not be needed to be executed when separating the organic light emitting display device into panel units by cutting the mother substrate. Therefore, any crack may not be formed on the first and second passivation layers 141 and 144, which may result in preventing permeation of moisture through the crack.

When the test for cutting the 4.3-inch organic light emitting display device formed as the unit of mother substrate was executed by the applicant several times under a temperature of 85° C. and 85% moisture, any crack was not found in the organic light emitting display device fabricated according to the present disclosure and permeation of moisture and foreign materials was not observed.

FIGS. 4A to 4H are views illustrating a method of fabricating an organic light emitting display device in accordance with the present disclosure.

Figure 4A:
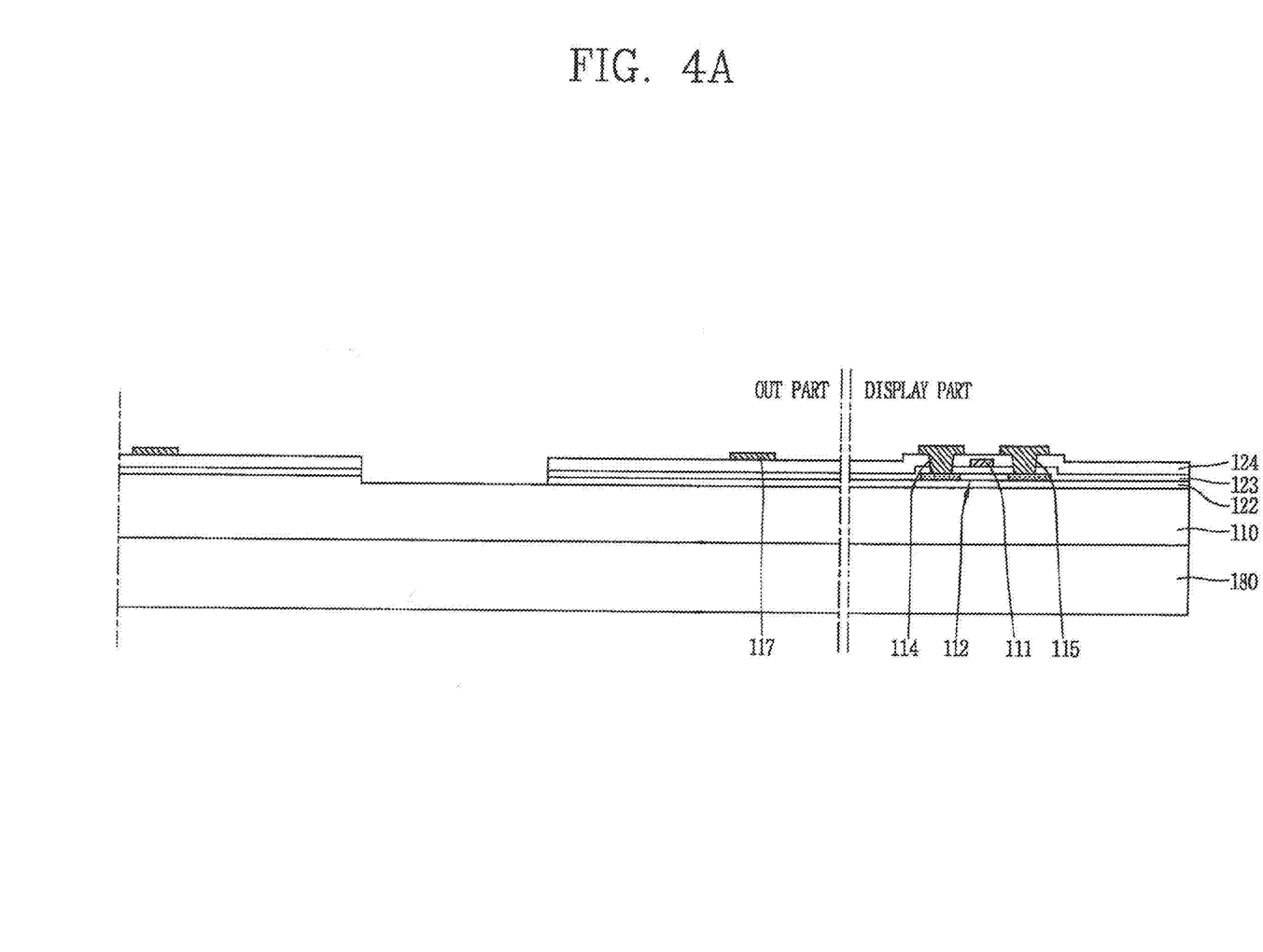
FIGS. 4A to 4H are views illustrating a method of fabricating an organic light emitting display device in accordance with the present disclosure.

As illustrated in FIG. 4A, a substrate 110 made of a plastic material such as polyimide (PI) may be attached onto a large mother substrate 180 made of glass or the like by using an adhesive. Here, the drawing merely illustrates two adjacent panel regions but the mother substrate 180 may include N×M (N, M≥2) panel regions. Therefore, N×M substrates 110 may be attached by a preset interval. Also, the substrates 110 having substantially the same area as that of the mother substrate 180 may be attached onto the mother substrate 180.

Afterwards, a buffer layer 122 made of an inorganic material or the like may be formed on the substrate 110. Here, the buffer layer 122 may be implemented into a single layer or a plurality of layers. Afterwards, transparent oxide semiconductor or crystalline silicon may be deposited on the entire substrate 110 by chemical vapor deposition (CVD), followed by etching, thereby forming a semiconductor layer 112 on the buffer layer 122. Here, the crystalline silicon layer may be formed by depositing the crystalline silicon or by depositing amorphous silicon and crystallizing the amorphous silicon by various crystallization methods such as laser crystallization and the like. $n^+$ or $p^+$ type impurity may be doped on both side surfaces of the crystalline silicon layer, forming doped layers.

Afterwards, an inorganic insulating material such as $SiO_2$ or SiNx may be deposited on the semiconductor layer 112 by CVD to form a first insulating layer 123. A non-transparent metal having high conductivity, such as Cr, Mo, Ta, Cu, Ti, Al or Al alloy may be deposited on the first insulating layer 123 by a sputtering process and etched by a photolithography process, thereby forming a gate electrode 111 on each pixel region of a display part. Then, an inorganic insulating material may be deposited on the entire substrate 110 having the gate electrode 111 by the CVD, thereby forming a second insulating layer 124.

Here, the buffer layer 122, the first insulating layer 123 and the second insulating layer 124 may also be formed on the outer part, except for the outermost region of the outer part, namely, on a region which is adjacent to another organic light emitting display panel and is to be cut later.

After forming contact holes for exposing the semiconductor layer 112 by etching the first and second insulating layers 123 and 124, a non-transparent metal having high conductivity, such as Cr, Mo, Ta, Cu, Ti, Al or Al alloy may be deposited on the entire substrate 110 by the sputtering process and then etched, thereby forming a source electrode 114 and a drain electrode 115, which are electrically connected to the semiconductor layer 112 through the contact holes, on the display part, and a pad 117 on the outer part.

Figure 4B:
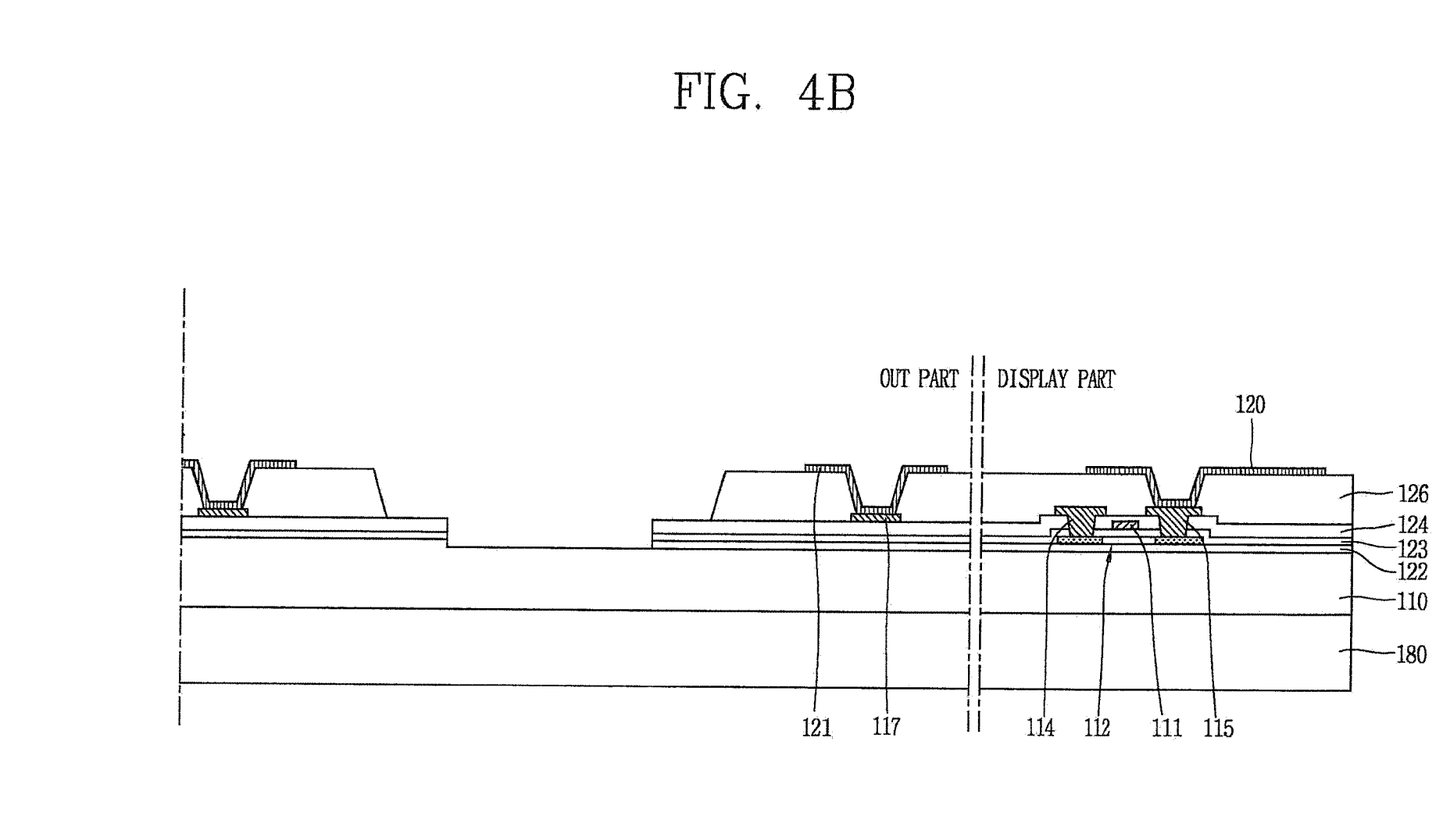

As illustrated in FIG. 4B, an inorganic insulating material may be deposited on the entire substrate 110 having the source and drain electrode 114 and 115 and the pad 117 to form a third insulating layer 126. The third insulating layer 126 may be partially etched to form a first contact hole 129a and a second contact hole 129b (see FIG. 4D) on the display part and the outer part, respectively. Here, the third insulating layer 126 may be formed by depositing $SiO_2$. Accordingly, the drain electrode 115 may be externally exposed through the first contact hole 129a, and the pad 117 may be externally exposed through the second contact hole 129b. The third insulating layer 126 may not be formed on the outermost region of the outer part, namely, a region which is adjacent to another organic light emitting display panel and is to be cut later.

Afterwards, a metal such as Ca, Ba, Mg, Al, or Ag may be deposited on the entire substrate 110 and then etched, thereby forming on the display part a pixel electrode 120, which is connected to the drain electrode 115 of the driving TFT through the first contact hole 129a, and the metal layer 121 on the outer part.

Figure 4C:
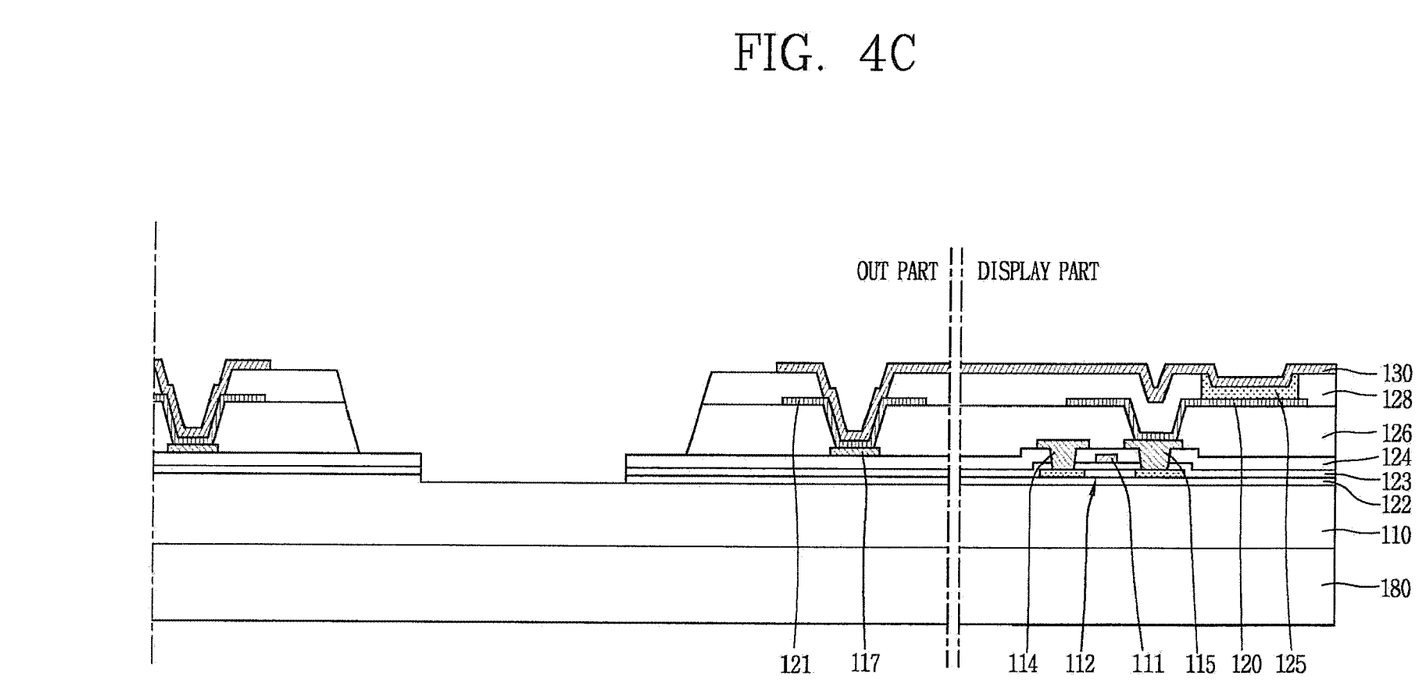

As illustrated in FIG. 4C, the bank layer 128 may be formed along the display part and the outer part. The bank layer 128 within the display part may partition each pixel region to prevent light of specific colors, output from adjacent pixel regions, from being output in a mixed state, and serve to reduce a stepped portion by filling a part of the first contact hole 129a. Here, the bank layer 128 may be formed by depositing and etching an organic insulating material, or by depositing an inorganic insulating material by CVD and etching the material.

Figure 4D:
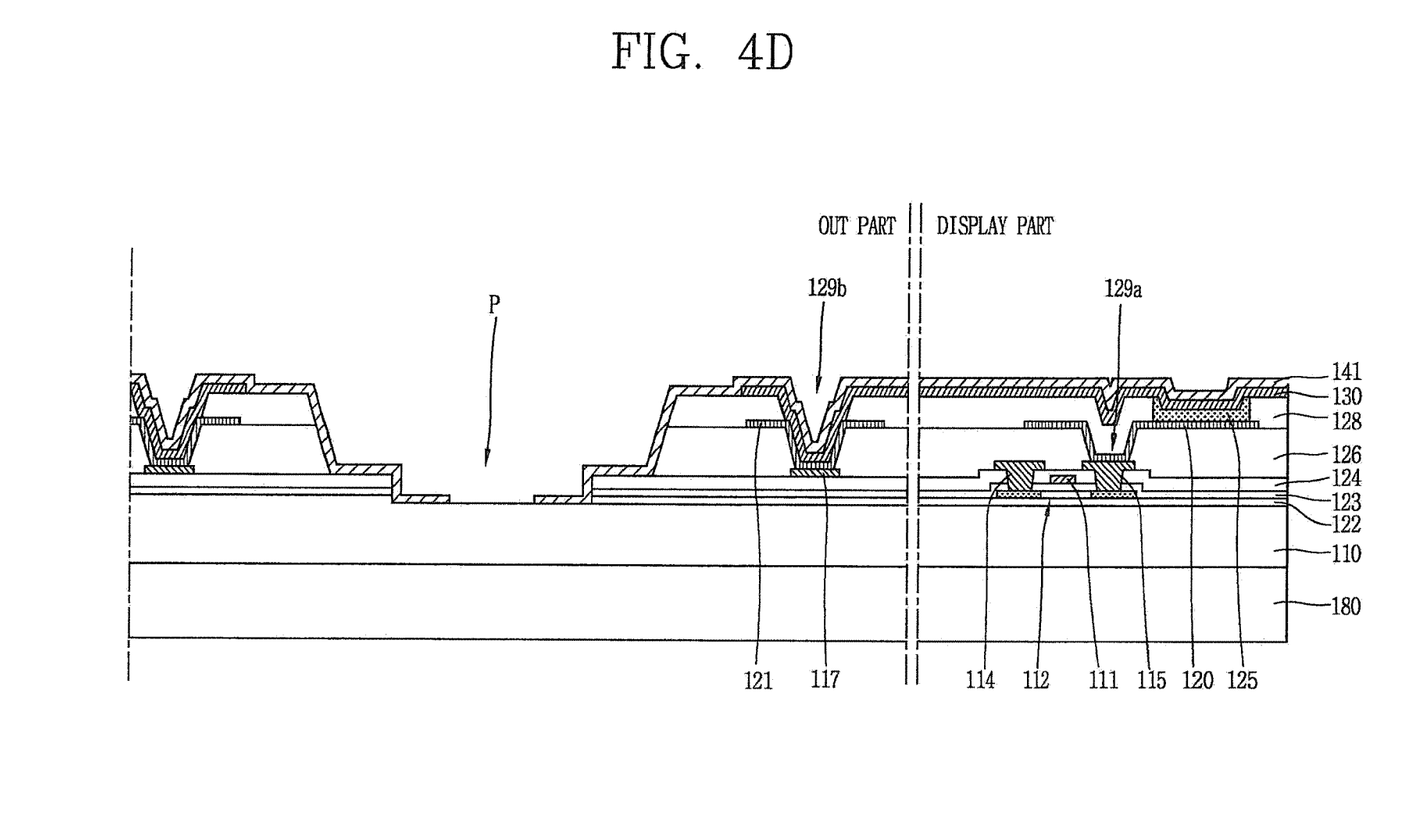

As illustrated in FIG. 4C, a transparent conductive material such as ITO or IZO may be deposited on the bank layer 128 and an organic light emitting unit 125 located at the bank layer 128 by the sputtering process, and then etched, to form a common electrode 130. Here, the common electrode 130 may be connected to the pad 117 through the second contact hole 129b via the metal layer 121, so as to allow a signal to be applied to the pad 117 within the display part. Then, as illustrated in FIG. 4D, an inorganic material may be deposited on the common electrode 130 and the bank layer 128 to form a first passivation layer 141.

Here, the first passivation layer 141 may cover the insulating layers 122 and 123 of the outer part and a part of the first passivation layer 141 may further extend to be disposed directly on the substrate 110. However, the first passivation layer 141 may not be formed on a region P which is adjacent to another organic light emitting display panel and is to be cut later.

Figure 4E:
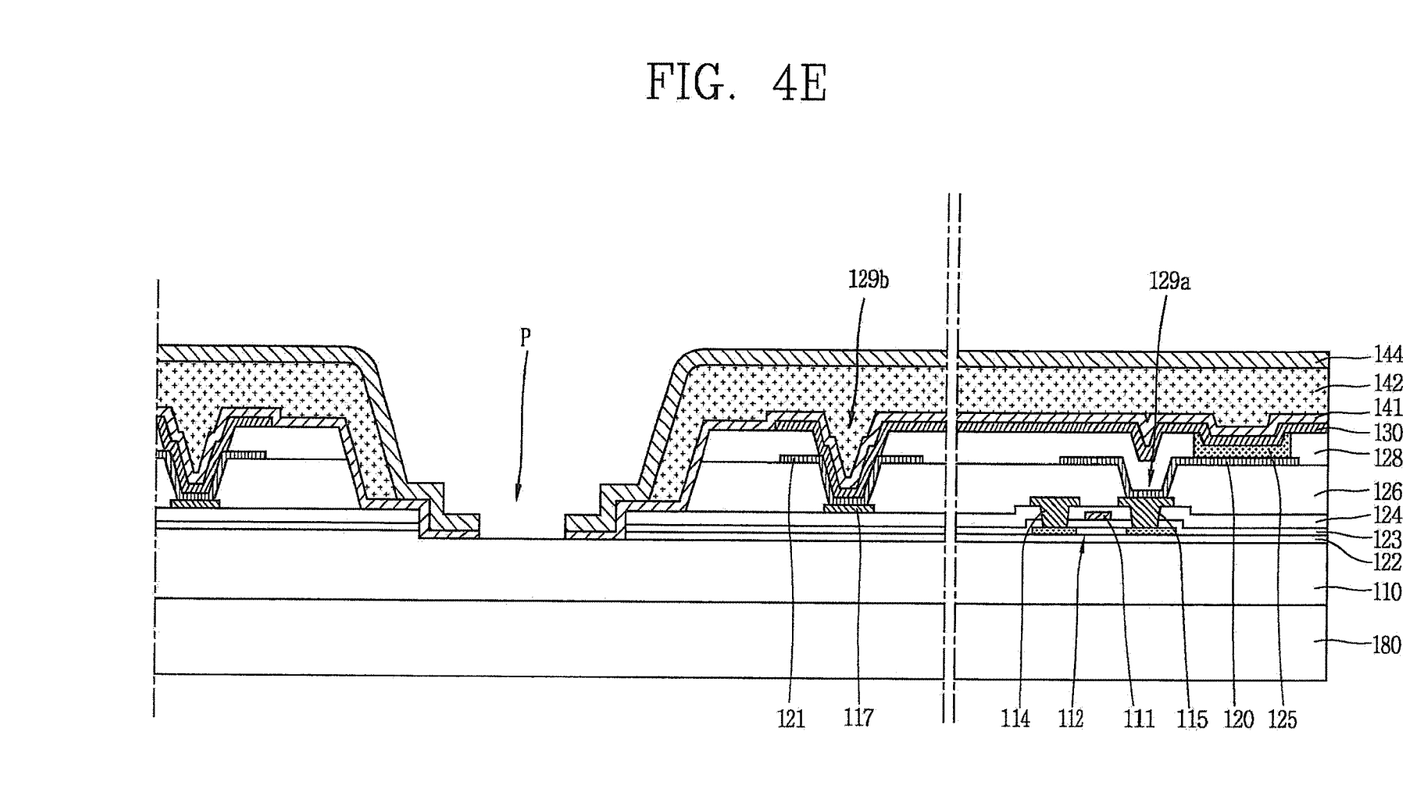

Afterwards, as illustrated in FIG. 4E, an organic material such as polymer or the like may be deposited on the first passivation layer 141 to form an organic layer 142. Here, the organic layer 142 may be formed by screen printing. That is, although not shown, after a screen is placed on the substrate 110 and polymer is deposited on the screen, pressure may be applied onto the polymer by a doctor blade or a roll, thereby forming the organic layer 142.

The organic layer 142 may be about 8 to 10 μm thick and extend up to a preset region of the outer part, so as to completely cover the bank layer 128. Or, the organic layer 142 may cover only a part of the bank layer 128 of the outer part or only up to an end portion of the bank layer 128.

Afterwards, an inorganic material such as $SiO_2$ or $SiNx$ may be deposited on the organic layer 142, thereby forming a second passivation layer 144 on the organic layer 142. Here, the second passivation layer 144 may extend up to an end portion of the first passivation layer 141, but may not be formed on a region P which is adjacent to another organic light emitting display panel and is to be cut later.

Figure 4F:
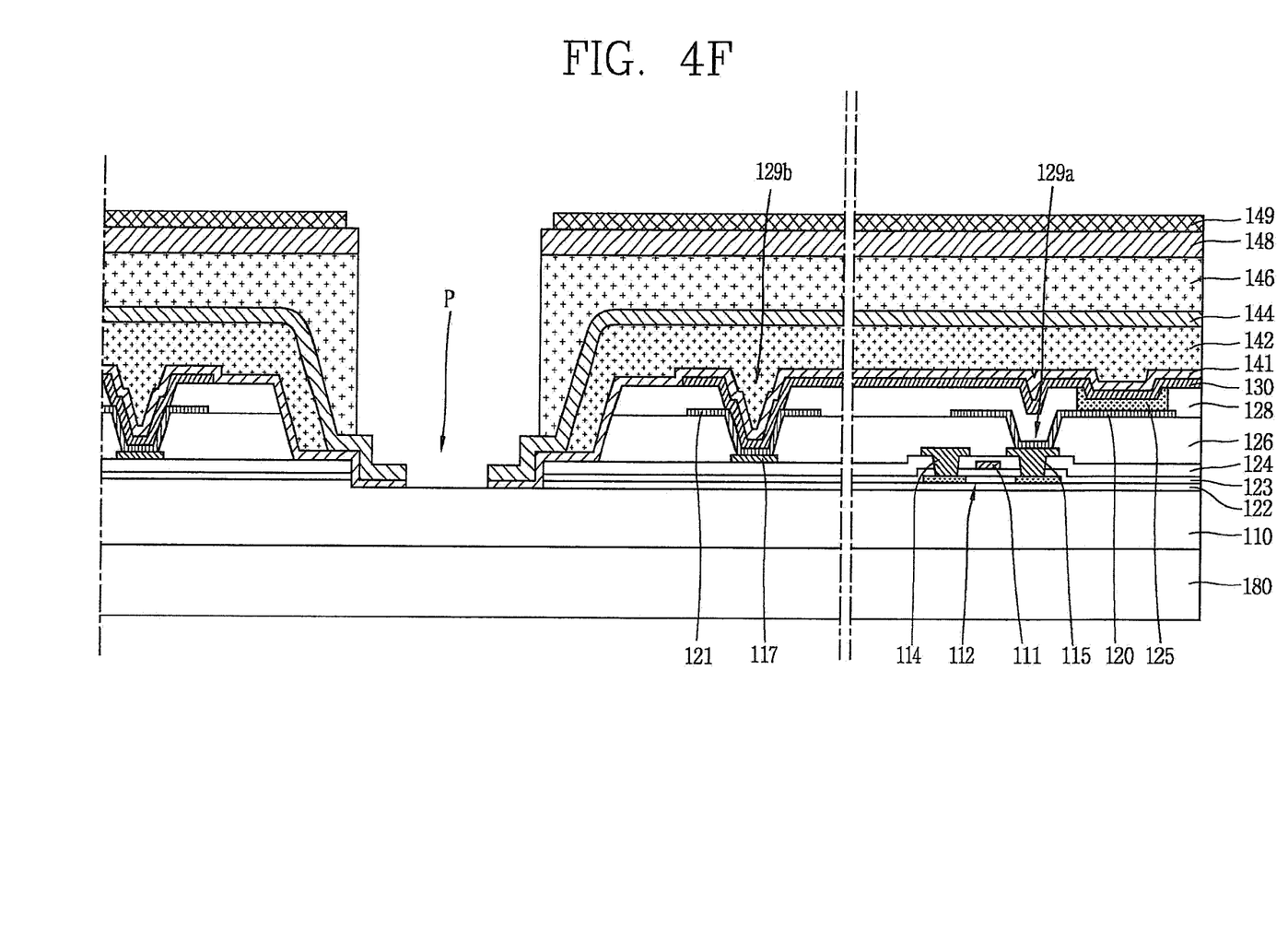

As illustrated in FIG. 4F, an adhesive layer 146 may be formed by depositing an adhesive onto the second passivation layer 144. A protection film 148 may be laid on the adhesive layer 146 to be pressed to adhere the protection film 148. Here, thermosetting resin or photocurable resin may be used as the adhesive. For use of the thermosetting resin, heat may be applied after adhering the protection film 148. For use of the photocurable resin, the protection film 148 may be adhered and light may be irradiated to cure the adhesive layer 146.

Afterwards, a polarizing plate 149 may be attached onto the protection film 148, thereby fabricating N×M organic light emitting electrode display panels on the mother substrate 180.

Here, as illustrated, since the insulating layers and the passivation layers are not formed at all on a boundary area between the organic light emitting panels formed on the mother substrate 180, a region P where the substrate 110 is exposed to the outside may be generated. When a plastic substrate 110 such as polyimide having a similar area to a display panel is attached onto the mother substrate 180 and a structure is formed on each substrate 110, the plastic substrate may not be disposed between the adjacent panels. Therefore, glass of the mother substrate 180 may be exposed directly through the exposed region P.

Figure 4G:
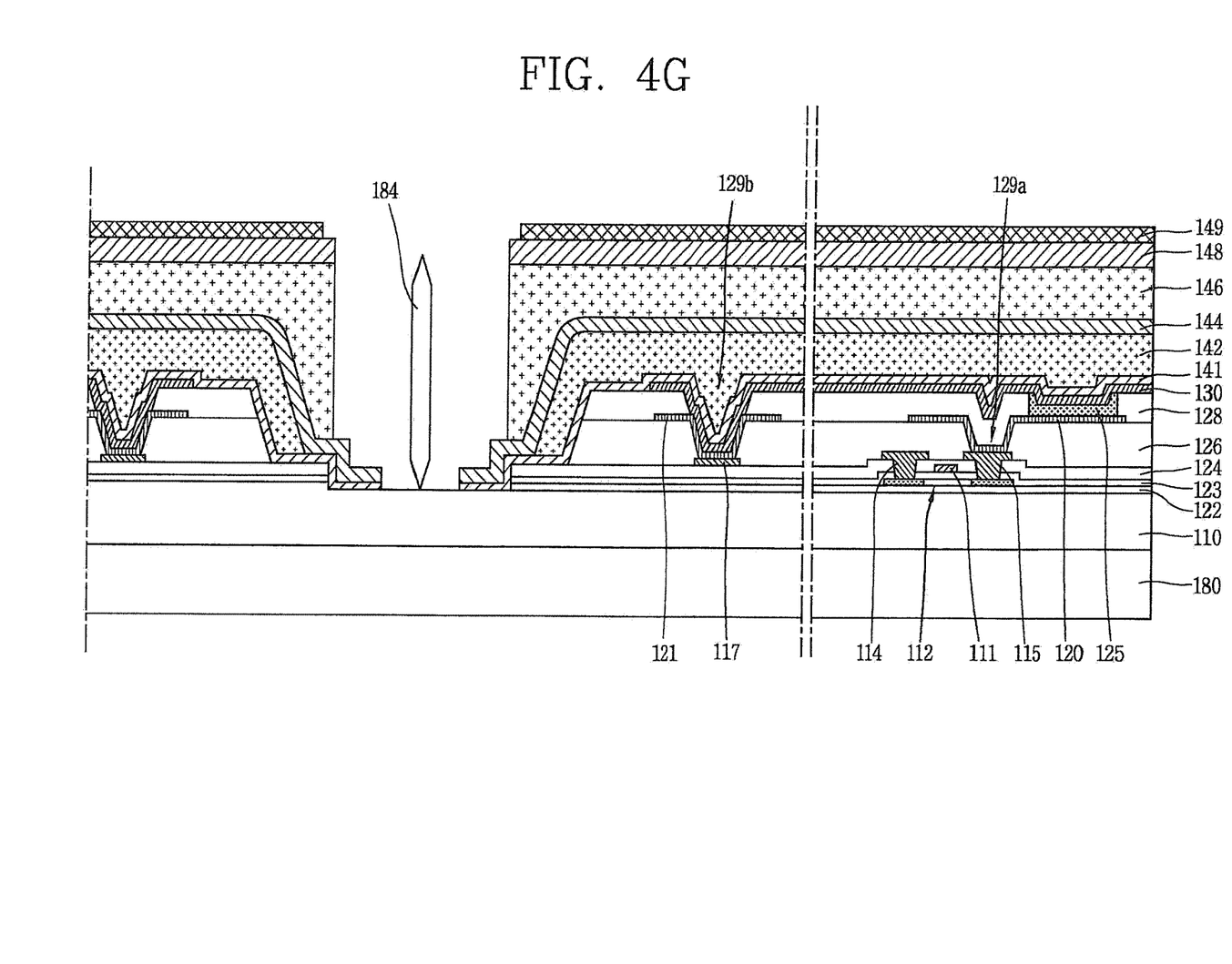

Afterwards, as illustrated in FIG. 4G, a cutting wheel 184 may be aligned on the exposed region P between the adjacent panels. The cutting wheel 184 may then be driven to cut the mother substrate 180 and the substrate 110 to divide the mother substrate 180 into a plurality of unit panels. Here, since any passivation layers 141 and 144 are not formed on the exposed region P, cutting of the passivation layers 141 and 144 may not be caused. This may result in preventing generation of a crack on the passivation layer 141 and 144 during the cutting process.

The drawing merely illustrates that the cutting wheel is used to cut the mother substrate 180. However, the present disclosure can also use a laser, such as a YAG laser or $CO^2$ laser, without being limited to the mechanical cutting wheel and.

Figure 4H:
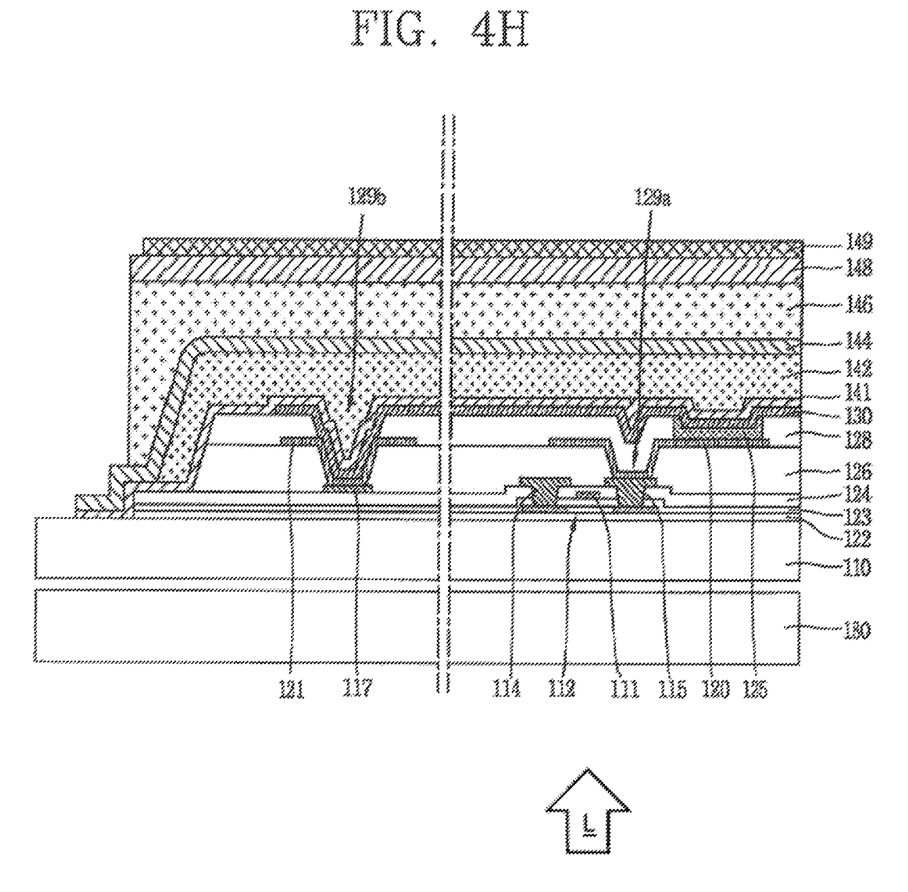

As illustrated in FIG. 4H, the substrate 110 may be separated from the mother substrate 180 by irradiating laser beams L in a direction from the mother substrate 180 to each separated organic light emitting display panel or applying heat onto the display panel, thereby completely fabricating a flexible organic light emitting display device.

As described, a passivation layer may be removed from the outermost region of an outer part of a flexible organic light emitting display device. This may prevent cutting of any passivation layer by a cutting tool when a plurality of organic light emitting display devices are separated by cutting a mother substrate. This may prevent the production of cracks on the passivation layer due to the cutting, resulting in preventing permeation of moisture or foreign materials through the cracks.

Meanwhile, the detailed description illustrates an organic light emitting display device having a specific structure, but the present disclosure may not be limited to this. For example, the aforementioned organic light emitting display device merely has a structure that light is emitted upwardly, namely, through a protection film. However, the present disclosure may not be limited to the structure but be applicable to a structure that light is emitted downwardly, namely, through a substrate. In this case, a transparent conductive material may be used as a pixel electrode and a non-transparent metal may be used as a common electrode.

Also, the detailed description merely illustrates a driving TFT with a top-gate structure, but the present disclosure may also be applicable to a bottom gate structure and other various structures of TFTs.

In other words, the detailed description illustrates specific structures for a driving TFT, electrodes, and an organic light emitting unit, but the present disclosure may also be applicable to different structures without being limited to those specific structures. That is, if a passivation layer is not formed on an outermost region of an organic light emitting display device to expose a substrate, structures of a driving TFT, electrodes, and an organic light emitting unit, which have currently well known, may all be applied.

The foregoing embodiments and advantages are merely exemplary and are not to be construed as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A method for fabricating an organic light emitting display device comprising:
    providing a mother substrate having a plurality of panel regions;
    attaching a substrate onto each panel region of the mother substrate, the substrate having a display part and an outer part;
    forming an organic light emitting structure on the display part of the substrate;
    forming a first passivation layer on the display part of the substrate and a partial region of the outer part;
    forming an organic layer on the first passivation layer;
    forming a second passivation layer on the display part on the organic layer and the partial region of the outer part, wherein the first passivation layer and the second passivation layer are absent at an outermost region of the outer part of each panel region; and
    dividing the mother substrate into the plurality of panel regions by cutting the mother substrate between adjacent ones of the plurality of panel regions of the mother substrate where the first passivation layer and the second passivation layer are absent.

2. The method of claim 1, wherein the organic light emitting structure is formed on a plurality of pixel regions of the display part of the substrate, and the forming of the organic light emitting structure comprises:
    forming a thin film transistor on each pixel region;
    forming a first electrode on each pixel region;
    forming an organic light emitting unit on the first electrode, the organic light emitting unit emitting light; and
    forming a second electrode on the organic light emitting unit.

3. The method of claim 1, wherein the substrate is a flexible substrate.

4. The method of claim 1, wherein the cutting of the mother substrate comprises cutting the mother substrate using a cutting wheel.

5. The method of claim 1, wherein the cutting of the mother substrate comprises cutting the mother substrate by irradiating laser beams.

6. The method of claim 1, wherein the mother substrate is a glass substrate.

7. The method of claim 1, wherein after forming the second passivation layer, the mother substrate is exposed to an outside of the organic light emitting display device between the adjacent ones of the plurality of panel regions.

8. The method of claim 1, further comprising:
    separating the mother substrate from the substrate.

9. The method of claim 8, wherein the separating the mother substrate from the substrate comprises irradiating laser beams from a rear surface of the mother substrate.

10. The method of claim 1, wherein the first passivation layer and the second passivation layer are both made of a same material.

11. The method of claim 10, wherein the first passivation layer and the second passivation layer are both made of $SiO_2$ or $SiN_x$.

* * * * *